United States Patent
Wu

(10) Patent No.: US 6,670,254 B1
(45) Date of Patent: Dec. 30, 2003

(54) METHOD OF MANUFACTURING SEMICONDUCTOR DEVICE WITH FORMATION OF A HEAVILY DOPED REGION BY IMPLANTATION THROUGH AN INSULATION LAYER

(75) Inventor: Kun-Jung Wu, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/065,298

(22) Filed: Oct. 1, 2002

(51) Int. Cl.$^7$ .............................................. H01L 21/336
(52) U.S. Cl. ........................ 438/305; 438/306; 438/514; 438/527; 438/231
(58) Field of Search ................................ 438/527, 514, 438/791, 229, 230, 231, 232, 299, 301, 303, 305, 306

(56) References Cited

U.S. PATENT DOCUMENTS

| | | | | |
|---|---|---|---|---|
| 4,818,714 A | * | 4/1989 | Haskell | 438/231 |
| 6,004,852 A | * | 12/1999 | Yeh et al. | 438/303 |
| 6,153,483 A | * | 11/2000 | Yeh et al. | 438/299 |
| 6,218,251 B1 | * | 4/2001 | Kadosh et al. | 438/303 |
| 6,506,650 B1 | * | 1/2003 | Yu | 438/301 |

* cited by examiner

Primary Examiner—Richard Elms
Assistant Examiner—Beth E. Owens
(74) Attorney, Agent, or Firm—Jianq Chyun IP Office

(57) ABSTRACT

A method of manufacturing semiconductor devices. A gate structure is formed over a substrate. A dopant implantation is carried out to form a lightly doped region in the substrate on each side of the gate structure. An insulation layer is formed over the substrate. A portion of the insulation is later removed so that a portion of the insulation layer is retained over the substrate on each side of the gate structure. A spacer is formed on each sidewall of the gate structure. Another ion implantation is carried out such that the dopants penetrate through the insulation layer on the substrate on each side of the gate structure to form a heavily doped region in the substrate.

13 Claims, 3 Drawing Sheets

METHOD OF MANUFACTURING SEMICONDUCTOR DEVICE WITH FORMATION OF A HEAVILY DOPED REGION BY IMPLANTATION THROUGH AN INSULATION LAYER

BACKGROUND OF INVENTION

1. Field of Invention

The present invention relates to a method of manufacturing integrated circuits. More particularly, the present invention relates to a method of manufacturing semiconductor devices.

2. Description of Related Art

As semiconductor manufacturing continues to progress, the fabrication of metal-oxide semiconductor (MOS) devices having a smaller line width on a larger chip is rendered possible. With such miniaturization, more powerful functions are incorporated into a single silicon chip at a lower cost. However, as the level of integration increases, dimensions of each device are reduced to 0.18 $\mu$m or smaller. A reduction of the channel width of a MOS device often leads to short channel effect and a punch-through of the doped ions in the source/drain regions. Ultimately, the MOS device may lose control.

When short channel effect is important, depletion regions generated at the source/drain regions of a MOS device will affect their mutual connections as well as connection with the channel. Hence, sub-threshold current of the MOS device will increase due to the passage of more electrons. With an increase in sub-threshold current, the MOS device may jump to an "open" or a "close" state without a control voltage at the gate of the MOS device and the intended switching action through the application of a gate voltage to a MOS device is lost.

Hot electron effect is another phenomenon that affects the operation of the MOS device as channel length is shortened. When applied voltage across the MOS device remains unchanged, later electric field inside the channel will increase. Hence, some hot electrons having energy higher than the ones at thermal equilibrium may be produced. Through the action of these high-energy hot electrons, a substrate current that may affect normal connectivity of the channel may be generated leading to an electrical breakdown.

One of the most effective means of reducing short channel effect is to form a doped region having a dopant concentration lower than the source/drain region in the original MOS source/drain region close to the channel. This region is referred to as a lightly doped region.

A conventional method of forming a lightly doped drain region in a semiconductor device includes forming a plurality of gate structures inside the memory region and peripheral circuit region of a substrate. Using the gate structure as a mask, a dopant implantation is conducted to form lightly doped regions in the substrate on each side of the gate structure. A silicon nitride layer is formed over the substrate and the silicon nitride layer is etched to form spacers on each sidewall of the gate structure. Thereafter, source/drain regions are formed in the substrate on each side of the gate structure. An N+ source/drain region and a P+ source/drain region are formed in the substrate within the NMOS device region of the peripheral circuit region and on each side of the gate structure within the PMOS device region. A self-aligned contact (SAC) process is conducted to form an inter-dielectric layer over the substrate. A plurality of contact openings that exposes the source/drain regions (including the source/drain regions of the memory cell region and the peripheral circuit region) is formed in the dielectric layer using the spacers as an alignment mask. Finally, conductive material is deposited into the contact openings to form contacts.

In the aforementioned process, if the silicon nitride spacer has considerable thickness (such as 400 Å), short-channel effect and hot electron effect of the device is minimized to an acceptable level. However, as the level of integration of semiconductor devices continues to increase, some problems will appear. As the level of integration increases and the line width of each device shrinks, distance between neighboring gate structures also reduces. Hence, thickness of the silicon nitride spacer must be reduced. Once the spacer thickness is reduced to about 300 Å or smaller, not only will short-channel effect and hot electron effect re-appear, the spacers will also be over-etched in subsequent self-aligned contact etching process leading to short circuiting between the gate structure and subsequently formed contact.

To counter the problem, a silicon nitride liner layer (having a thickness of about 150 Å) is formed over the substrate before carrying out a self-aligned contact process so that short circuiting between the gate structure and subsequently formed contact due to over-etching can be prevented. Nevertheless, this additional step not only complicates the manufacturing process, but also leads to a reduction in contact area between the contact and the source/drain region and a lowering of device performance. Furthermore, because the process requires two separate etching operations, the substrate may be over-etched leading to a defective lattice structure. On the other hand, if the silicon nitride spacer is too thick, the silicon nitride liner layer formed before the self-aligned process may fill up the gap between neighboring gate structures and hence may affect subsequent manufacturing steps.

SUMMARY OF INVENTION

Accordingly, one object of the present invention is to provide a method of manufacturing semiconductor devices. By retaining a portion of the silicon nitride layer in the process of forming the lightly doped drain region, the silicon substrate is protected against plasma damage. This residual silicon nitride layer is further capable of attenuating the energy level of both the N+ ions and the P+ ions automatically during an ion implantation so that the device can have a more stable performance.

To achieve these and other advantages and in accordance with the purpose of the invention, as embodied and broadly described herein, the invention provides a method of manufacturing semiconductor devices. A gate structure is formed over a substrate. A dopant implantation is carried out to form a lightly doped region in the substrate on each side of the gate structure. An insulation layer is formed over the substrate. A portion of the insulation is later removed so that a portion of the insulation layer is retained over the substrate on each side of the gate structure. A spacer is formed on each sidewall of the gate structure. Another ion implantation is carried out such that the dopants penetrate through the insulation layer on the substrate on each side of the gate structure. Ultimately, a heavily doped region is formed in the substrate outside the spacer-covered region on each side of the gate structure.

In this invention, the insulation layer over the substrate on each side of the gate structures is not entirely removed during the etching operation. Since the insulation layer has a definite thickness, spacers on the sidewalls of the gate structures can have considerable thickness to prevent dopants in subsequently formed source/drain region from diffusing into the lightly doped drain region leading to a deterioration of device properties. Moreover, the insulation layer covers the substrate throughout the etching operation so that damages to the substrate due to over-etching are largely prevented.

Because the spacers have a definite thickness, subsequent self-aligned contact process requires no additional line pad layer to prevent the over-etching of spacers leading to a possible short-circuit between the gate structure and the subsequently formed contact. Hence, this invention not only ensures a sufficient contact area between the contact and the source/drain region, but also reduces the number of processing steps.

In addition, the residual insulation layer over the substrate on each side of the gate structures also prevents possible structural damages to the substrate due to a subsequent dopant (plasma) implantation.

Furthermore, the implanted dopants penetrate through the insulation layer before ending up in the substrate to form a heavily doped region (the source/drain region). Consequently, energy levels of the N+ or P+ ions in the implantation are automatically adjusted to produce a device having a more stable performance.

This invention also provides a second method of forming semiconductor devices. A substrate having a memory cell region and a peripheral circuit region are provided. A plurality of first gate structures is formed on the memory cell region and a plurality of second gate structures is formed on the peripheral circuit region. A lightly doped region is formed in the substrate on each side of the first gate structures and the second gate structures. A first insulation layer is formed over the substrate. A portion of the first insulation layer is removed so that the first insulation layer between neighboring first gate structures and neighboring second gate structures is converted to a second insulation layer. Next, spacers are formed on the sidewalls of the first gate structures and the second gate structures. A first dopant implantation is carried out such that the dopants penetrate through the second insulation layer between neighboring first gate structures to form a first heavily doped region in the substrate on each side of the first gate structures just outside the spacer-covered regions. Similarly, a second dopant implantation is carried out such that the dopants penetrate through the second insulation layer between neighboring second gate structures to form a second heavily doped region in the substrate on each side of the first gate structures just outside the spacer-covered regions. An inter-layer dielectric layer is formed over the substrate. The inter-layer dielectric layer is patterned and the second insulation layer is removed to form a plurality of self-aligned contact openings that expose the first heavily doped regions and the second heavily doped regions. Conductive material is deposited to fill the self-aligned contact openings and form contacts.

In this invention, the first insulation layer over the substrate on each side of the gate structures is not entirely removed during the etching operation. Since the retained second insulation layer has a definite thickness, spacers on the sidewalls of the first and the second gate structures can have considerable thickness to prevent dopants in subsequently formed source/drain region from diffusing into the lightly doped drain region leading to a deterioration of device properties. Moreover, the substrate remains covered throughout the etching of the first insulation layer so that the substrate is prevented from any damage due to over-etching.

Because the spacers have a definite thickness, subsequent self-aligned contact process requires no additional line pad layer to prevent the over-etching of spacers leading to a possible short-circuit between the gate structure and subsequently formed contact. Hence, this invention not only ensures a sufficient contact area between the contact and the source/drain region, but also reduces the number of processing steps.

In addition, the residual second insulation layer over the substrate on each side of the first gate structures and the second gate structures also prevents possible structural damages to the substrate resulting from a subsequently dopant (plasma) implantation.

Furthermore, the implanted dopants penetrate through the second insulation layer before ending up in the substrate to form the heavily doped regions (the source/drain regions). Consequently, energy levels of the N+ or P+ ions in the implantation are automatically adjusted to produce devices having a more stable performance.

Finally, this invention uses fewer and simpler steps so that some production cost is saved.

It is to be understood that both the foregoing general description and the following detailed description are exemplary, and are intended to provide further explanation, of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
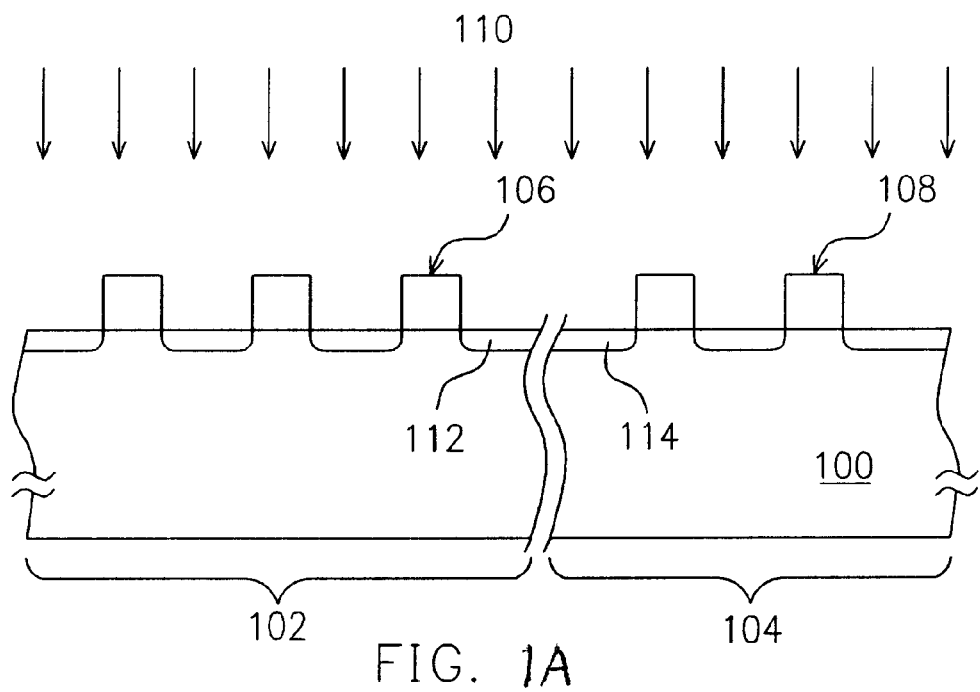
FIGS. 1A through 1F are cross-sectional views showing the progression of steps for forming a semiconductor device having lightly doped regions therein according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are cross-sectional views showing the progression of steps for forming a semiconductor device having lightly doped regions therein according to one preferred embodiment of this invention. A substrate 100 divided into a memory cell region 102 and a peripheral circuit region 104 is provided as shown in FIG. 1A.

The memory cell region 102 has a plurality of gate structures 106 and the peripheral circuit region 104 has a plurality of gate structures 108. The gate structures 106 and the gate structures 108 each comprises a gate dielectric layer, a gate conductive layer and a gate cap layer. To simplify the figure, the gate dielectric layer, the gate conductive layer and the gate cap layer are not shown. A dopant implantation 110 is carried out using the gate structures 106 and the gate structures 108 as a mask. Ultimately, lightly doped regions 112 and lightly doped regions 114 are formed in the substrate 100 on each side of the gate structures 106 and the gate structures 108 respectively. The dopant implantation 110 for forming the lightly doped regions 112 and 114 may be an ion implantation, for example.

Figure 1B:
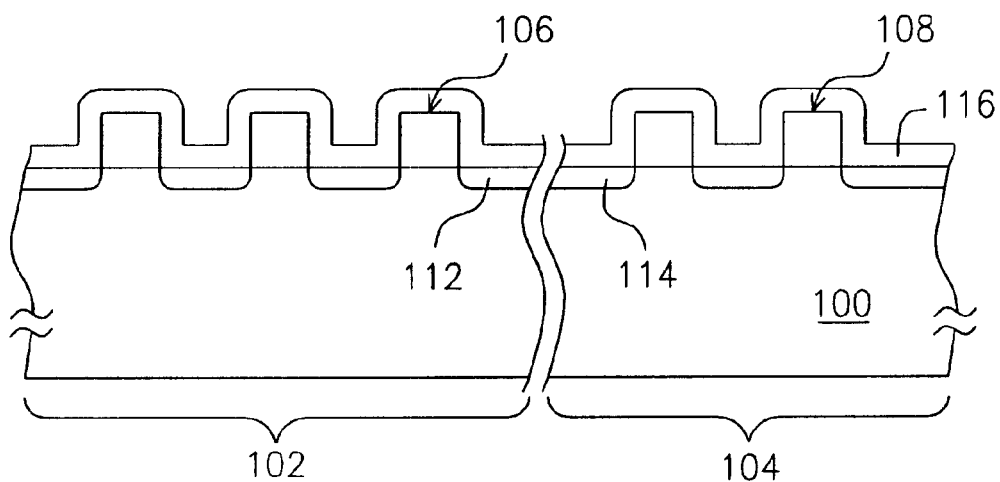

As shown in FIG. 1B, a conformal insulation layer 116 is formed over the substrate 100. The insulation layer 116 having a thickness preferably about 400 Å can be a silicon nitride layer formed, for example, by chemical vapor deposition.

Figure 1C:
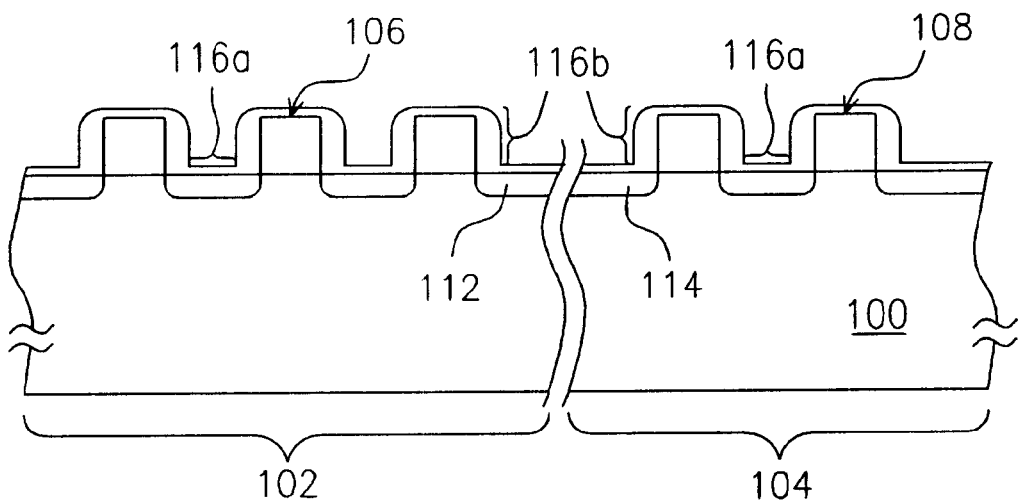

As shown in FIG. 1C, an etching operation is conducted to remove a portion of the insulation layer 116 between neighboring gate structures 106 and 108. Hence, a residual insulation layer 116a having a thickness between about 150 Å to 180 Å is formed. Spacers 116b are formed on the sidewalls of the gate structures 106 and 108. The insulation layer 116 is removed, for example, by anisotropic etching. Since an anisotropic etching operation will remove a portion of the insulation layer 116 between neighboring gate structures 106 and 108, the spacers 116b on the sidewalls of the gate structures 106 and 108 have considerable thickness.

Figure 1D:
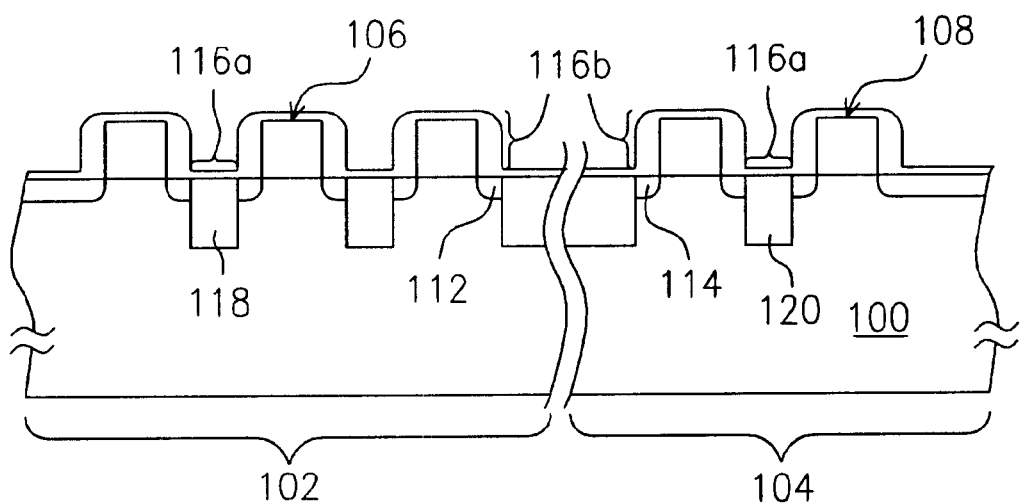

As shown in FIG. 1D, using the gate structure 106 and associated spacers 116b as a mask, a dopant implantation in the memory cell region 102 is carried out. The dopants penetrate the insulating layer 116a between neighboring gate structures 106 to form a heavily doped region 118 in the substrate 100 on each side of the gate structures 106. Thereafter, using the gate structure 108 and associated spacers 116b as a mask, another dopant implantation in the peripheral circuit region 104 is carried out. The dopants penetrate the insulation layer 116b between neighboring gate structures 108 to form a heavily doped region 120 in the substrate 100 on each side of the gate structures 108. The heavily doped regions 118 and 120 serve as source/drain regions. The heavily doped regions 118 and 120 are formed, for example, by ion implantation. The implanted dopants can be N+ dopants or P+ dopants, for example. Energy levels of the N+ or P+ ions in the ion implantation can be automatically adjusted to produce devices having a more stable performance. In a preferred embodiment, the energy levels of the N+ or P+ ions in the ion implantation depend on the thickness of the residual insulation layer 116a. For example, the energy levels of the N+ or P+ ions in the ion implantation can be adjusted in accordance with the thickness of the residual insulation layer 116a.

Figure 1E:
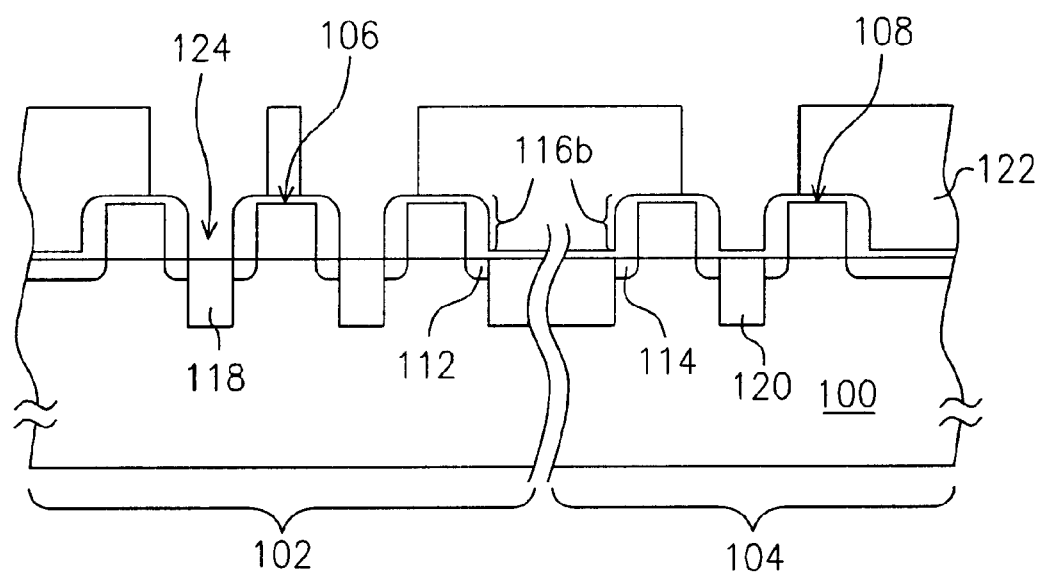

As shown in FIG. 1E, an inter-layer dielectric layer 122 is formed over the substrate 100. The inter-layer dielectric layer 122 is patterned to form a plurality of openings (not shown) above the heavily doped regions 118 and 120. The insulation layer 116a exposed by the openings is removed to form a plurality of self-aligned contact openings 124 that expose the heavily doped regions 118 and 120.

Figure 1F:
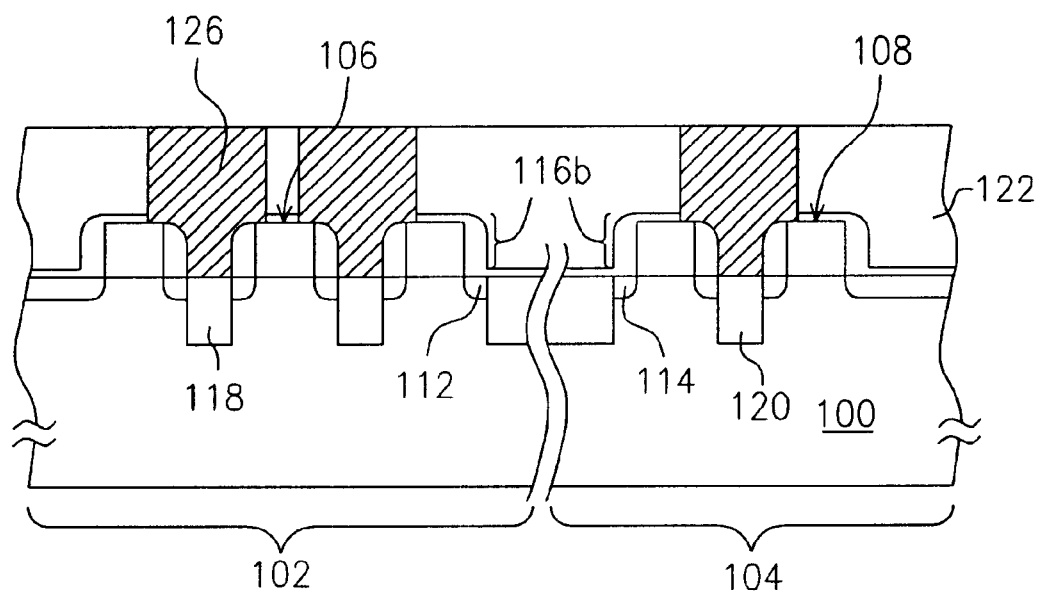

As shown in FIG. 1F, conductive material is deposited into the self-aligned contact openings 124. Conductive material outside the self-aligned contact openings 124 is removed to form a contact 126 inside each self-aligned contact opening 124. Conductive material outside the openings may be removed by conducting a chemical-mechanical polishing operation, for example. Thereafter, remaining processes for forming the semiconductor device are carried out. Since these processes are familiar to those skilled in semiconductor fabrication technologies, detailed descriptions are omitted here.

In this invention, the insulation layer 116 over the substrate 100 on each side of the gate structures 106 and 108 is not entirely removed during the etching operation.

Since the retained insulation layer 116a has a thickness of at least 150 Å to 180 Å, spacers 116b on the sidewalls of the first and second gate structures 106 and 108 can have considerable thickness. Hence, dopants are prevented from diffusing from the source/drain regions into surrounding lightly doped drain regions leading to a deterioration of device properties. Moreover, the substrate remains covered throughout the etching of the insulation layer 116 so that the substrate 100 is prevented from any damage due to over-etching.

Because the spacers 116b have a definite thickness, subsequent self-aligned contact process requires no additional liner pad layer to prevent the over-etching of spacers 116b leading to a possible short-circuit between the gate structures 106, 108 and subsequently formed contacts. Hence, this invention not only ensures a sufficient contact area between the contact 126 and the source/drain region (the heavily doped region 118 and 120), but also reduces the number of processing steps.

In addition, the residual insulation layer 116a over the substrate on each side of the gate structures 106 and 108 also prevents possible structural damage to the substrate 100 resulting from a subsequent dopant (plasma) implantation.

Furthermore, the implanted dopants penetrate through the residual insulation layer 116a before ending up in the substrate 100 to form the heavily doped regions 118 and 120 (the source/drain regions). Consequently, energy levels of the N+ or P+ ions in the implantation are automatically adjusted to produce devices having a more stable performance. This invention also uses fewer and simpler steps so that some production cost is saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing semiconductor devices, comprising the steps of:

providing a substrate;

forming a gate structure over the substrate;

conducting a first dopant implantation to form a lightly doped region in the substrate on each side of the gate structure;

forming an insulation layer over the substrate;

removing a portion of the insulation layer so that a portion of the insulation layer remains on each side of the gate structure and forms spacers on the sidewalls of the gate structure; and conducting a second dopant implantation such that the dopants penetrate through the insulation layer on each side of the gate structure to form a heavily doped region in the substrate.

2. The method of claim 1, wherein the step of removing a portion of the insulation layer includes an anisotropic etching method.

3. The method of claim 1, wherein material constituting the insulation layer includes silicon nitride.

4. The method of claim 1, wherein the insulation layer has a thickness of about 400Å.

5. The method of claim 1, wherein the residual insulation layer on the substrate on each side of the gate structure has a thickness between about 150 Å to 180 Å.

6. The method of claim 1, wherein the energy level of the second dopant implantation depends on the thickness of the residual insulation layer on the substrate on each side of the gate structure.

7. A method of manufacturing semiconductor devices, comprising the steps of:

provifing a substrate having a memory cell region and a peripheral circuit region thereon;

forming a plurality of first gate structures on the memory cell region and a plurality of second gate structures on the peripheral circuit region;

forming a lightly doped region on each side of the first gate structures and the second gate structures in the substrate;

forming a first insulation layer over the substrate;

removing a portion of the first insulation layer to make a residual first insulation layer between the neighboring first gate structures and between the neighboring second gate structures become a second insulation layer and forming spacers on the sidewalls of the first gate structures and the second gate structures;

conducting a first dopant implantation such that the dopants penetrate through the second insulation layer between neighboring first gate structures to form a first heavily doped region on each side of the first gate structures in the substrate;

conducting a second dopant implantation such that the dopants penetrate through the second insulation layer between neighboring second gate structures to form a second heavily doped region on each side of the second gate structures in the substrate;

forming an inter-layer dielectric layer over the substrate;

patterning the inter-layer dielectric layer and removing the second insulation layer to form a plurality of self-aligned contact openings that exposes the first heavily doped region and the second heavily doped region; and depositing conductive material into the self-aligned contact opening to form a contact in the substrate.

8. The method of claim 7, wherein the step of removing a portion of the first insulation layer includes an anisotropic etching method.

9. The method of claim 7, wherein material constituting the first insulation layer includes silicon nitride.

10. The method of claim 7, wherein the insulation layer has a thickness of about 400Å.

11. The method of claim 7, wherein the residual insulation layer on the substrate on each side of the gate structure has a thickness between about 150 Å to 180Å.

12. The method of claim 7, wherein the energy level of the first dopant implantation is adjusted in accordance with the thickness of the second insulation layer disposed between the first gate structures.

13. The method of claim 7, wherein the energy level of the second dopant implantation is adjusted in accordance with a thickness of the second insulation layer disposed between the second gate structures.

* * * * *